(12) United States Patent
Otsubo

(10) Patent No.: US 9,681,534 B2
(45) Date of Patent: Jun. 13, 2017

(54) CERAMIC MULTILAYER SUBSTRATE

(71) Applicant: Murata Manufacturing Co., Ltd., Nagaokakyo-shi, Kyoto-fu (JP)

(72) Inventor: Yoshihito Otsubo, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 432 days.

(21) Appl. No.: 13/975,568

(22) Filed: Aug. 26, 2013

(65) Prior Publication Data

US 2013/0341080 A1 Dec. 26, 2013

Related U.S. Application Data

(63) Continuation of application No. PCT/JP2012/056425, filed on Mar. 13, 2012.

(30) Foreign Application Priority Data

Mar. 25, 2011 (JP) .................................. 2011-067873

(51) Int. Cl.
*H05K 1/16* (2006.01)
*H05K 1/02* (2006.01)
(Continued)

(52) U.S. Cl.
CPC ........... *H05K 1/0213* (2013.01); *H05K 1/113* (2013.01); *H05K 3/4629* (2013.01)

(58) Field of Classification Search
CPC ...... H01R 43/28; H01R 12/72; H01R 12/722; H01R 12/724; H01R 12/725;
(Continued)

(56) References Cited

U.S. PATENT DOCUMENTS 6,800,815 B1 * 10/2004 Ehlert ............... H01L 23/49816
174/255
7,087,846 B2 * 8/2006 Alcoe ............... H01L 23/49811
174/267
(Continued)

FOREIGN PATENT DOCUMENTS

JP 01-259540 A 10/1989
JP 02-025045 A 1/1990
(Continued)

OTHER PUBLICATIONS

Sakai JP 2004104091 A English Translation.*
(Continued)

*Primary Examiner* — Pete Lee
(74) *Attorney, Agent, or Firm* — Keating & Bennett, LLP

(57) ABSTRACT

In a ceramic multilayer substrate including a ceramic laminate including ceramic layers, a surface electrode located on a surface of the ceramic laminate, and a cover ceramic layer that covers a peripheral portion of the surface electrode, a recess portion is provided in a peripheral portion of a surface electrode to extend along the periphery thereof, and the peripheral portion of the surface electrode includes a peripheral end portion thereof and a region in which the recess portion is covered with a cover ceramic layer. A height of a central portion of the surface electrode which is not covered with the cover ceramic layer is lower than a height of a primary surface of the ceramic laminate on which the surface electrode is located.

17 Claims, 10 Drawing Sheets

(51) Int. Cl.
*H05K 1/11* (2006.01)
*H05K 3/46* (2006.01)

(58) Field of Classification Search
CPC ...... H01R 12/727; H05K 1/165; H05K 1/167; H05K 1/18; H05K 1/181; H05K 1/182; H05K 1/183; H05K 1/184; H05K 1/185; H05K 2201/0317; H05K 2201/041; H05K 2201/049; H05K 2201/09763; H05K 2201/09872; H05K 2201/10446; H05K 2201/10674; H05K 3/30; H05K 3/32; H05K 3/341; H05K 3/3415; H05K 3/3421; H05K 3/3431; H05K 3/36; H05K 3/46; H05K 1/0254; H05K 1/0286; H05K 1/0287; H05K 1/0289; H05K 1/029; H05K 1/0292; H05K 1/0293; H05K 23/5226; H05K 1/0206; H05K 1/0221; H05K 1/0222; H05K 1/0225; H05K 1/0251; H05K 1/112; H05K 1/114; H05K 1/115; H05K 1/116; H05K 2201/09063; H05K 2201/09072; H05K 2201/0919; H05K 2201/092; H05K 2201/09509; H05K 2201/09518; H05K 2201/09527; H05K 2201/09536; H05K 2201/09545; H05K 2201/09554; H05K 2201/09581; H05K 2201/096; H05K 2201/09609; H05K 2201/09618; H05K 2201/09627; H05K 2201/09636; H05K 2201/09809; H05K 2201/09818; H05K 2201/09827; H05K 2201/09836; H05K 2201/09845; H05K 2201/09854; H05K 2201/09863; H05K 3/4061; H05K 3/4069; H05K 3/4602; H05K 2201/0305; H05K 2201/09572; H05K 2203/0455; H05K 2201/09718; H05K 3/4046; H05K 2201/037; H05K 2201/0959; H05K 2201/09645; H05K 2201/10666; H05K 3/42; H05K 3/421; H05K 3/429; H05K 1/113; H05K 2201/09563; H05K 1/11; H05K 1/186; H05K 2201/09227; H05K 2201/09236; H05K 2201/09245; H05K 2201/09254; H05K 2201/09263; H05K 2201/09272; H05K 2201/09281; H05K 2201/0929; H05K 2201/093; H05K 2201/09309; H05K 2201/09318; H05K 2201/09327; H05K 2201/09345; H05K 2201/09354; H05K 2201/09363; H05K 2201/09372; H05K 2201/09381; H05K 2201/0939; H05K 2201/094; H05K 2201/09409; H05K 2201/09418; H05K 2201/09427; H05K 2201/09436; H05K 2201/09445; H05K 2201/09463; H05K 2201/09472; H05K 2201/09481; H05K 2201/0949; H05K 2201/09654; H05K 2201/09663; H05K 2201/09672; H05K 2201/09681; H05K 2201/0969; H05K 2201/097; H05K 2201/09709; H05K 2201/09727; H05K 2201/09754; H05K 2201/09772; H05K 2201/09781; H05K 2201/0979; H05K 2201/098; H05K 7/02; H05K 1/187; H05K 1/188; H05K 1/0263; H05K 2201/0183; H05K 2201/0187; H05K 2201/0191; H05K 2201/0195
USPC .......... 257/734–786; 174/260–262; 361/760, 361/777, 792–795
See application file for complete search history.

(56) References Cited

U.S. PATENT DOCUMENTS

| | | | | |
|---|---|---|---|---|
| 7,208,834 | B2* | 4/2007 | Lee | H01L 24/11 257/737 |
| 7,915,088 | B2* | 3/2011 | Kobayashi | H01L 21/4853 174/258 |
| 2002/0171145 | A1* | 11/2002 | Higuchi | H01L 23/13 257/738 |
| 2003/0080409 | A1* | 5/2003 | Nakamura | H01L 23/49822 257/700 |
| 2004/0060174 | A1* | 4/2004 | Imafuji | H01L 21/4857 29/831 |
| 2005/0155792 | A1 | 7/2005 | Ito et al. | |
| 2008/0258300 | A1 | 10/2008 | Kobayashi et al. | |
| 2009/0166069 | A1 | 7/2009 | Kinoshita | |
| 2010/0044416 | A1 | 2/2010 | Ogawa | |

FOREIGN PATENT DOCUMENTS

| | | |
|---|---|---|
| JP | 10-209612 A | 8/1998 |
| JP | 11-204941 A | 7/1999 |
| JP | 2004-104091 A | 4/2004 |
| JP | 2004-200608 A | 7/2004 |
| JP | 2007-036059 A | 2/2007 |
| JP | 2008-091874 A | 4/2008 |
| JP | 2008-263125 A | 10/2008 |
| JP | 2010-074153 A | 4/2010 |
| JP | 2011-049342 A | 3/2011 |
| JP | 8-213756 A | 8/2013 |

OTHER PUBLICATIONS

JP 2004104091A English Translation hereinafter Sakai.*
JP 2004-104091A English Translation hereinafter Sakai.*
Official Communication issued in International Patent Application No. PCT/JP2012/056425, mailed on May 1, 2012.

\* cited by examiner

CERAMIC MULTILAYER SUBSTRATE

BACKGROUND OF THE INVENTION

1. Field of the Invention

The present invention relates to a ceramic multilayer substrate and more particularly relates to a ceramic multilayer substrate in which surface electrodes are located on surfaces of a ceramic laminate including a plurality of ceramic layers.

2. Description of the Related Art

In general, a ceramic multilayer substrate has the structure in which surface electrodes and internal conductors are provided on surfaces of and inside a ceramic substrate (substrate body) containing a plurality of ceramic layers laminated to each other.

In the ceramic multilayer substrate as described above, in order to secure mounting reliability, the surface electrode is required to have a sufficient peeling strength so as not to cause any practical problems.

Incidentally, as one factor that decreases the peeling strength of the surface electrode provided on a surface of the ceramic multilayer substrate, for example, an influence of a plating liquid used in a plating step of forming a plating film on a surface of the surface electrode is known.

The reason for this is that since the plating liquid remains on the surface of the ceramic multilayer substrate, the interface between a ceramic and the surface electrode, both of which form the ceramic multilayer substrate, becomes fragile.

In addition, since the surface electrode is liable to be peeled off from its peripheral end portion (peripheral edge portion) which functions as a starting point, when the plating liquid remains at the peripheral end portion (peripheral edge portion) of the surface electrode, the peeling strength thereof is remarkably influenced.

For example, as shown in FIG. 18, when a main portion of a surface electrode 52 including a peripheral end portion (peripheral edge portion) thereof is formed on the surface of an outermost ceramic layer 51 which forms a ceramic multilayer substrate (see FIG. 11 of Japanese Unexamined Patent Application Publication No. 2004-104091), since a peripheral end portion (peripheral edge portion) 52a of the surface electrode 52 is located at a boundary with the ceramic layer 51, and a plating liquid is liable to remain at this position, the peeling strength of the surface electrode is liable to be decreased.

In addition, in the case (see FIG. 2 of Japanese Unexamined Patent Application Publication No. 2004-104091) in which the peripheral end portion (peripheral edge portion) 52a of the surface electrode 52 is covered with a cover ceramic layer 53 as shown in FIG. 19, the plating liquid may also enter through a boundary portion 53 between the ceramic layer 51 and the surface electrode 52 in some cases. In the case described above, the plating liquid reaches the peripheral end portion (peripheral edge portion) of the surface electrode 52 covered with the cover ceramic layer 53 and remains, and as a result, the peeling strength is disadvantageously decreased.

In addition, in the state in which the plating liquid remains, if a drying step is performed, the ceramic multilayer substrate is exposed to a drying temperature higher than ordinary temperature. In the case as described above, for example, when a Ni plating film (lower layer) and an Au plating film (upper layer) are each formed as a plating film, diffusion of Ni into an Au plating film occurs. The reason for this is that since the ionization tendency of Ni is higher than that of Au, Au is likely to be replaced with Ni. In addition, the diffusion of Ni may cause stains and discoloration, and as a result, appearance defects may occur in some cases. Furthermore, when a Ni plating film (lower layer) and a Sn plating film (upper layer) are each formed as the plating film, if the drying temperature is increased, oxidation and/or fusion of Sn may disadvantageously occur in some cases.

SUMMARY OF THE INVENTION

Preferred embodiments of the present invention provide a highly reliable ceramic multilayer substrate including a surface electrode with a sufficient peeling strength, even after a plating step is carried out.

A ceramic multilayer substrate according to a preferred embodiment of the present invention is a ceramic multilayer substrate including a ceramic laminate including ceramic layers and a surface electrode located on a surface of the ceramic laminate, and in a region located inward from a peripheral end portion of the surface electrode, a recess portion is provided.

With the structure as described above, even when a plating liquid adheres in a plating step, since the plating liquid remains in the recess portion (groove) provided in the region located inward from the peripheral end portion of the surface electrode, corrosion of the peripheral end portion of the surface electrode, which is liable to function as a starting point of electrode fracture and/or electrode peeling, caused by the plating liquid is suppressed or prevented, and even after the plating step is carried out, a highly reliable ceramic multilayer substrate including a surface electrode with a sufficient peeling strength is provided. That is, since the thickness of the peripheral end portion (peripheral edge portion) of the surface electrode is small, and plating adhesion thereto is liable to be insufficient, when the plating liquid remains, the peripheral end portion of the surface electrode is corroded by the plating liquid, and the interface between a ceramic and the surface electrode becomes fragile, so that the peripheral end portion of the surface electrode functions as the starting point of electrode fracture. However, according to a preferred embodiment of the present invention, since the plating liquid remains in the recess portion (groove) provided in the region located inward from the peripheral end portion of the surface electrode, the peripheral end portion of the surface electrode is suppressed or prevented from being corroded by the plating liquid, and hence, even after the plating step is carried out, the peeling strength of the surface electrode is maintained high. In addition, in the region located inward from the peripheral end portion of the surface electrode in which the recess portion is provided, since the thickness of the surface electrode is larger than that of a peripheral end portion, even if the plating liquid remains in the recess portion, the influence of a decrease in peeling strength caused by the corrosion of the surface electrode is within an acceptable range, and hence the peeling strength of the surface electrode is secured.

In addition, in the ceramic multilayer substrate of a preferred embodiment of the present invention, the recess portion is preferably arranged to extend along the periphery of the surface electrode. As a result, a higher peeling strength of the surface electrode is maintained.

In addition, the ceramic multilayer substrate according to a preferred embodiment of the present invention preferably is a ceramic multilayer substrate including a ceramic laminate of ceramic layers laminated to each other and a surface electrode located on a surface of the ceramic laminate, and the surface electrode is arranged so that the height of a peripheral portion thereof is higher than that of a central portion of the surface electrode.

With the structure as described above, even when a plating liquid remains after a plating step is carried out, since the plating liquid remains in a region located inward from the peripheral portion including a peripheral end portion (peripheral edge portion), as in the case described above, even after the plating step is carried out, a highly reliable ceramic multilayer substrate including a surface electrode with a sufficient peeling strength is provided.

In addition, the ceramic multilayer substrate according to a preferred embodiment of the present invention is a ceramic multilayer substrate including a ceramic laminate including ceramic layers, a surface electrode located on a surface of the ceramic laminate, and a cover ceramic layer arranged to cover a peripheral portion of the surface electrode. In the ceramic multilayer substrate described above, a recess portion is provided in the peripheral portion of the surface electrode, and in addition, the peripheral portion of the surface electrode includes a peripheral end portion thereof and a region in which the recess portion is provided and is covered with the cover ceramic layer.

With the structure as described above, a plating liquid which adheres in a plating step is blocked by the cover ceramic layer and is not likely to reach the peripheral portion of the surface electrode. In addition, even when the plating liquid enters through the interface between the cover ceramic layer and the surface electrode, since the recess portion is provided at a position located inward from the peripheral end portion of the surface electrode, the plating liquid which enters as described above remains in the recess portion and is not likely to reach the peripheral end portion of the surface electrode, and even after the plating step is carried out, a highly reliable ceramic multilayer substrate including a surface electrode with a sufficient peeling strength is provided.

In addition, in the ceramic multilayer substrate according to a preferred embodiment of the present invention, the recess portion is preferably arranged to extend along the periphery of the surface electrode. As a result, a high peeling strength of the surface electrode is maintained.

In addition, in the ceramic multilayer substrate according to a preferred embodiment of the present invention, the height of a central portion of the surface electrode which is not covered with the cover ceramic layer is preferably lower than the height of a primary surface of the ceramic laminate on which the surface electrode is located.

With the structure as described above, a plating liquid which adheres in a plating step is blocked by the cover ceramic layer and is not likely to reach the peripheral portion including the peripheral end portion (peripheral edge portion) of the surface electrode, and in addition, since the plating liquid which adheres in the plating step remains in a central portion of the surface electrode having a lower height than that of the primary surface of the ceramic laminate, even after the plating step is carried out, a highly reliable ceramic multilayer substrate including a surface electrode with a sufficient peeling strength is provided.

In addition, in the ceramic multilayer substrate according to a preferred embodiment of the present invention, at least a portion of the surface electrode is preferably provided in the surface of the ceramic laminate.

In addition, "at least a portion of the surface electrode is provided in the surface of the ceramic laminate" indicates that at least a portion of the surface electrode is buried in the surface of the ceramic laminate, and, for example, the following cases are described to explain and included in the concept of this structure.

The first case is a case in which a portion of the surface electrode other than a predetermined exposed portion thereof is buried in the ceramic laminate so that the exposed portion is at the same level as that of the surface of the ceramic laminate (the height of the exposed portion is the same as that of the ceramic laminate).

The second case is a case in which a portion of the surface electrode other than a predetermined exposed portion thereof is buried in the ceramic laminate so that the height of an exposed portion is lower than that of the ceramic laminate.

The third case is a case in which a portion of the surface electrode is buried in the ceramic laminate so that the height of the exposed portion of the surface electrode is slightly higher than that of the ceramic laminate.

With the structure as described above, the surface electrode is arranged so as not to project from the surface of the ceramic laminate or so as to reduce a projection amount (distance) of an upper surface of the surface electrode projecting from the surface of the ceramic laminate, and hence the reduction in height of the ceramic multilayer substrate is promoted.

In addition, a plating film is preferably formed on at least a portion of a surface of the surface electrode. As a result, a high peeling strength of the surface electrode is maintained.

In the ceramic multilayer substrate according to various preferred embodiments of the present invention, even when a plating liquid adheres in a plating step, corrosion caused by the plating liquid at a peripheral end portion of the surface electrode, which is likely to function as a starting point of electrode fracture and/or electrode peeling, is suppressed or prevented, and even after the plating step is carried out, a highly reliable ceramic multilayer substrate including a surface electrode with a sufficient peeling strength is provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, with reference to examples of preferred embodiments of the present invention, advantages and features of the present invention will be described in more detail.

Figure 1:
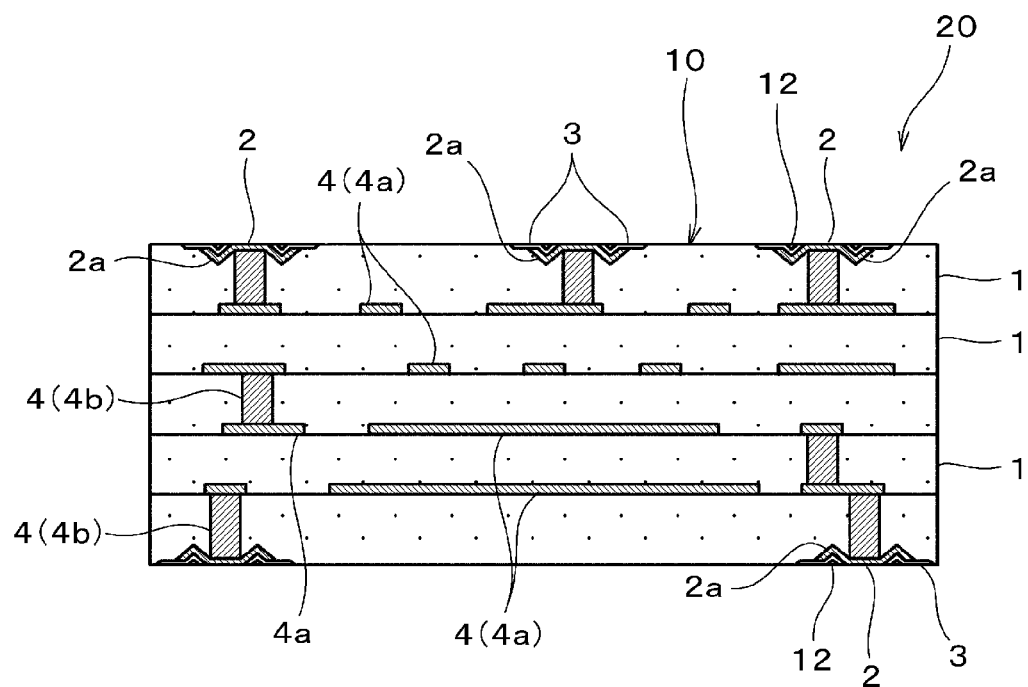
FIG. 1 is a front cross-sectional view of the structure of a ceramic multilayer substrate according to one example (Example 1) of a preferred embodiment of the present invention.
Figure 2:
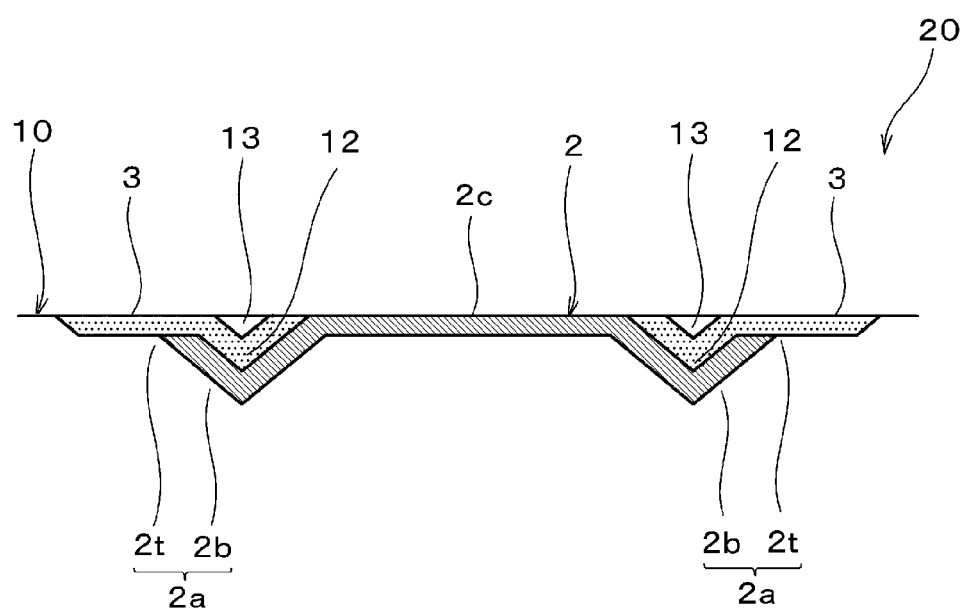
FIG. 2 is a view showing an important portion of the ceramic multilayer substrate according to the example (Example 1) of a preferred embodiment of the present invention.

FIG. 1 is a cross-sectional view showing the structure of a ceramic multilayer substrate 20 according to an example of a preferred embodiment of the present invention, and FIG. 2 is an enlarged view schematically showing an important portion of the ceramic multilayer substrate 20 shown in FIG. 1.

The ceramic multilayer substrate 20 includes a ceramic laminate (substrate body) 10 including ceramic layers 1 laminated to each other, surface electrodes (Ag electrodes each containing Ag as a primary component in this example) 2 located on surfaces of the ceramic laminate 10, cover ceramic layers 3 arranged to cover peripheral portions 2a of the surface electrodes 2, and internal conductors 4, such as internal wires 4a and via hole conductors 4b, provided in the ceramic laminate 10.

In addition, as shown in FIG. 2, a recess portion 12 is located in the peripheral portion 2a of the surface electrode 2 along the periphery thereof, and the peripheral portion 2a of the surface electrode 2 includes a peripheral end portion (peripheral edge portion) 2t thereof and a region 2b in which the recess portion 12 is arranged to extend along the periphery of the surface electrode 2 and is covered with the cover ceramic layer 3. In addition, in the cover ceramic layer 3, a groove 13 is provided in a region corresponding to the recess portion 12.

In addition, on the surface of a central portion (exposed portion) 2c of the surface electrode 2, a Ni plating film and an Au plating film covering the Ni plating film are preferably provided. In FIGS. 1 and 2, the Ni plating film and the Au plating film are not shown.

In the ceramic multilayer substrate 20 of Example 1, since the recess portion 12 is provided in the peripheral portion 2a of the surface electrode 2 along the periphery thereof, and the peripheral portion 2a of the surface electrode 2 including the peripheral end portion (peripheral edge portion) 2t and the region 2b in which the recess portion 12 is provided is covered with the cover ceramic layer 3, a plating liquid which adheres in a plating step is blocked by the cover ceramic layer 3 and is not likely to reach the peripheral portion 2a of the surface electrode 2 (in particular, the peripheral end portion (peripheral edge portion) 2t of the surface electrode 2). In addition, even when the plating liquid enters through the interface between the cover ceramic layer 3 and the surface electrode 2, since the recess portion 12 is provided in the peripheral portion 2a of the surface electrode 2 along the periphery thereof, the plating liquid which enters as described above is not likely to reach the peripheral portion 2a of the surface electrode 2 (in particular, the peripheral end portion (peripheral edge portion) 2t of the surface electrode 2). As a result, even after the plating step is carried out, a highly reliable ceramic multilayer substrate 20 including a surface electrode 2 with a sufficient peeling strength is reliably obtained.

Next, a non-limiting example of method for manufacturing the above ceramic multilayer substrate 20 will be described.

Figure 3:
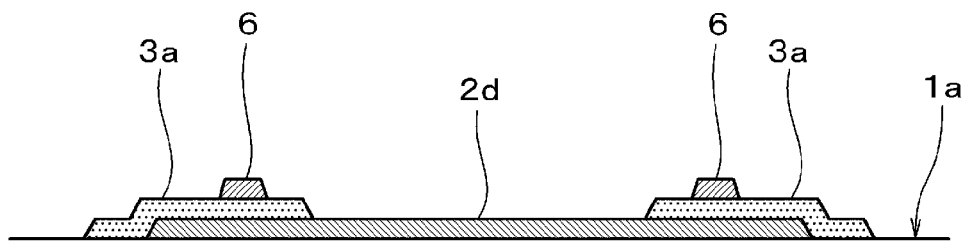
FIG. 3 is a view illustrating a method for manufacturing the ceramic multilayer substrate according to Example 1 of a preferred embodiment of the present invention.

First, as shown in FIG. 3, an electrode paste (Ag paste in this example) used for surface electrode formation is applied on a ceramic green sheet 1a, which is to be formed into the ceramic layer 1 (FIGS. 1 and 2) by firing, to form an electrode paste pattern 2d, and a ceramic paste to be formed into the cover ceramic layer 3 (FIGS. 1 and 2) by firing is applied to cover a peripheral portion of this electrode paste pattern 2d and to expose a central portion thereof, so that a ceramic paste pattern 3a is formed. The ceramic paste pattern 3a is arranged so as to cover a region from the outside of a peripheral end portion of the electrode paste pattern 2d to the inside thereof by about 100 μm, for example.

Subsequently, a resin paste to be fired, decomposed, and eliminated by a firing step is applied on the ceramic paste pattern 3a in a region that is withdrawn or located inward by about 50 μm from the peripheral end portion of the electrode paste pattern 2d so as to form a resin paste pattern 6 having a width of about 30 μm along the periphery of the electrode paste pattern 2d.

In addition, after the ceramic green sheet 1a is laminated with other ceramic green sheets in a predetermined order so as to be the outermost layer, pressure bonding is performed to obtain a green laminate having a flat primary surface.

Figure 4:
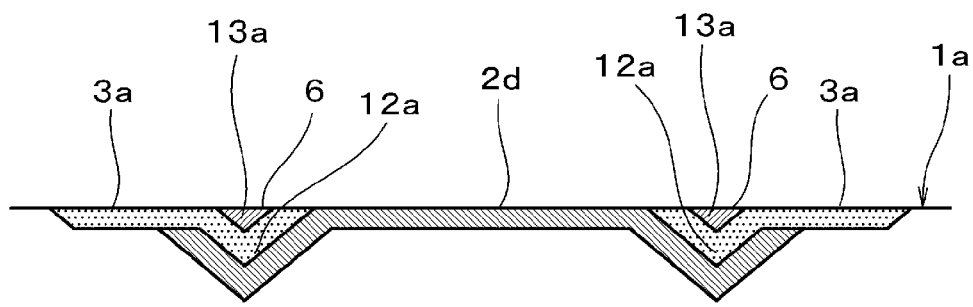
FIG. 4 is a view illustrating the method for manufacturing the ceramic multilayer substrate according to Example 1 of a preferred embodiment of the present invention.

In this pressure bonding step, as shown in FIG. 4, the resin paste pattern 6 presses a portion of the ceramic paste pattern 3a (the cover ceramic layer 3 obtained by firing) and a portion of the electrode paste pattern 2d (the surface electrode 2 obtained by firing), each portion being located under the resin paste pattern 6. As a result, a recess portion (groove) 13a is formed in the ceramic paste pattern 3a (the cover ceramic layer 3 obtained by firing), and a recess portion (groove) 12a is formed in the electrode paste pattern 2d (the surface electrode 2 obtained by firing). In addition, the electrode paste pattern 2d (the surface electrode 2 obtained by firing) itself is also provided in the ceramic green sheet 1a. Hence, the height of the ceramic multilayer substrate 20 obtained by firing is reduced.

Subsequently, this green laminate is fired to burn and decompose the resin paste pattern. As a result, after the resin paste is burned, decomposed, and eliminated, the recess portions are formed.

Accordingly, as shown in FIGS. 1 and 2, the ceramic multilayer substrate 20 is obtained in which the recess portion is provided in the peripheral portion 2a of the surface electrode 2 along the periphery thereof, and the peripheral portion 2a of the surface electrode 2 including the peripheral end portion (peripheral edge portion) 2t and the region 2b in which the recess portion 12 is provided is covered with the cover ceramic layer 3.

In the method described above, although a recess portion 13 corresponding to the recess portion 12 provided along the periphery of the surface electrode 2 is also preferably provided in the cover ceramic layer 3, the recess portion 13 may not be provided in the cover ceramic layer 3.

In addition, the recess portion 12 may also be formed by a method in which after the electrode paste pattern 2d has been applied and dried, embossing is performed thereon. After the embossing is performed, when a ceramic paste is applied, a ceramic multilayer substrate having the structure in which no recess portion is formed in the cover ceramic layer is obtained.

In the present invention, the method for forming a recess portion is not particularly limited, and alternative to the methods described above, after the electrode paste pattern and the ceramic paste pattern are formed, the recess portions may also be formed by embossing.

In addition, in the above example of the manufacturing method, in the pressure bonding step, although the electrode paste pattern preferably is entirely provided in the ceramic green sheet, the electrode paste pattern may not be entirely provided therein. In this case, for example, although the exposed portion of the surface electrode is located higher than the primary surface of the laminate, the advantages of preferred embodiments the present invention are also obtained.

Figure 5:
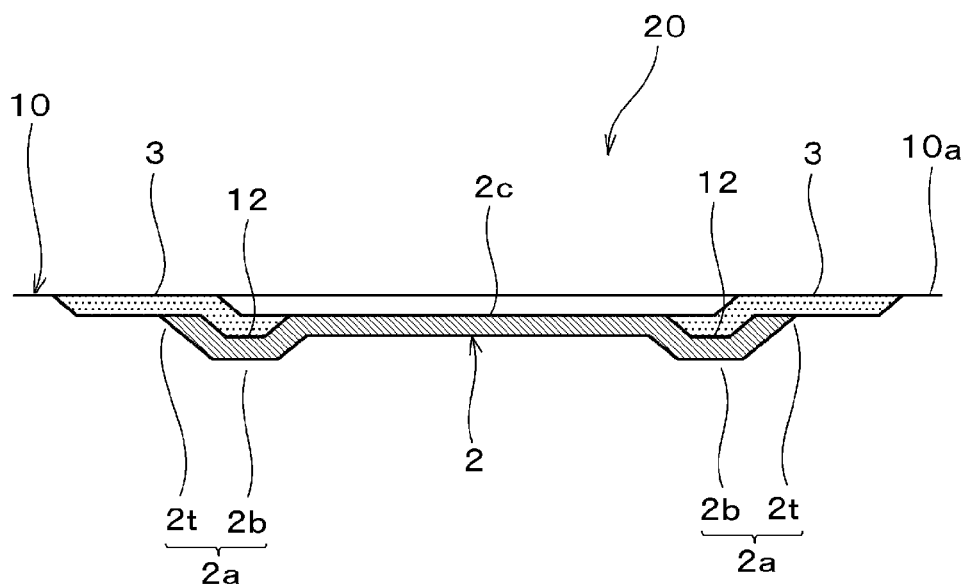
FIG. 5 is a view showing an important portion of a ceramic multilayer substrate according to another example (Example 2) of a preferred embodiment of the present invention.

FIG. 5 is a view showing the structure of an important portion of a ceramic multilayer substrate 20 according to Example 2 of a preferred embodiment of the present invention.

In the ceramic multilayer substrate of Example 2, a recess portion 12 is provided in a peripheral portion 2a of a surface electrode 2 along the periphery thereof, and in addition, a peripheral end portion (peripheral edge portion) 2t of the surface electrode 2 and a region 2b in which the recess portion is provided are covered with a cover ceramic layer 3 which includes a step portion.

In addition, the ceramic multilayer substrate 20 of Example 2 is preferably arranged so that the height of a central portion (exposed portion) 2c, which is not covered with the cover ceramic layer 3, of the surface electrode 2 is lower than the height of a primary surface 10a of a ceramic laminate (substrate body) 10 on which the surface electrode 2 is provided.

In this case, the height indicates a distance from the other primary surface of the ceramic laminate (substrate body) 10 facing the primary surface 10a to each of the respective surfaces. The surface indicates a surface located at a primary surface 10a side of the ceramic laminate (substrate body) 10. That is, the height of the central portion (exposed portion) 2c, which is not covered with the cover ceramic layer 3, of the surface electrode is a distance from the other primary surface of the ceramic laminate (substrate body) 10 to the surface of the central portion (exposed portion) 2c of the surface electrode 2. In addition, the height of the primary surface 10a of the ceramic laminate (substrate body) 10 on which the surface electrode 2 is provided indicates a distance from the other primary surface of the ceramic laminate (substrate body) 10 to the primary surface 10a thereof.

In addition, although not particularly shown in the drawing, the structures of other portions of the ceramic multilayer substrate 20 of Example 2 are similar to those of the ceramic multilayer substrate of Example 1.

In the case of this ceramic multilayer substrate 20, as in the ceramic multilayer substrate 20 of Example 1, a plating liquid which adheres in a plating step is blocked by the cover ceramic layer 3 and is not likely to reach the peripheral end portion (peripheral edge portion) 2t of the surface electrode 2, and in addition, since remaining at the central portion 2c, the height of which is lower than that of the primary surface 10a of the ceramic laminate (substrate body) 10, of the surface electrode 2, the plating liquid which adheres in the plating step is not likely to reach the peripheral end portion (peripheral edge portion) 2t of the surface electrode 2. Hence, even after the plating step is carried out, a surface electrode 2 having a sufficient peeling strength is still reliably formed.

In addition, since the height of the central portion 2c of the surface electrode 2 is lower than that of the primary surface 10a, for example, when a component using the ceramic multilayer substrate 20 is bump-connected, the height of the component obtained after mounting is significantly reduced.

In accordance with the case in which the above ceramic multilayer substrate of Example 1 is manufactured, this ceramic multilayer substrate of Example 2 can be manufactured, for example, by the following method.

Figure 6:
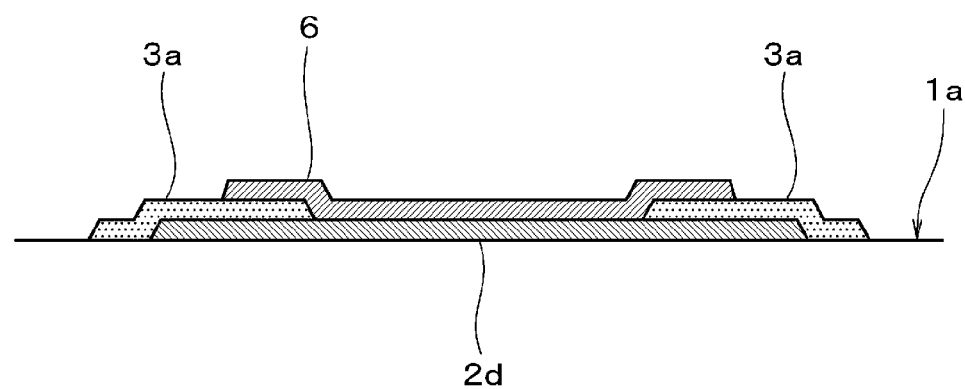
FIG. 6 is a view illustrating a method for manufacturing the ceramic multilayer substrate according to Example 2 of a preferred embodiment of the present invention.

As shown in FIG. 6, an electrode paste pattern 2d is formed on a ceramic green sheet 1a by applying an electrode paste used for surface electrode formation, and a ceramic paste pattern 3a is then formed by applying a ceramic paste, which is to be formed into a cover ceramic layer by firing, so as to cover a peripheral portion of this electrode paste pattern 2d and to expose a central portion thereof.

In addition, the ceramic paste pattern 3a is arranged so as to cover a region from outside of a peripheral end portion of the electrode paste pattern 2d to the inside thereof by about 100 μm.

Subsequently, a resin paste pattern 6 is formed by applying a resin paste, which is to be fired, decomposed, and eliminated in a firing step, to an entire region on the ceramic paste pattern 3a from a position withdrawn or located inward by about 50 μm from the peripheral end portion (peripheral edge portion) of the electrode paste pattern 2d to the inside thereof.

In addition, after this ceramic green sheet 1a is laminated with other ceramic green sheets in a predetermined order so as to be the outermost layer, pressure bonding is performed to form a green laminate having a flat primary surface.

Figure 7:
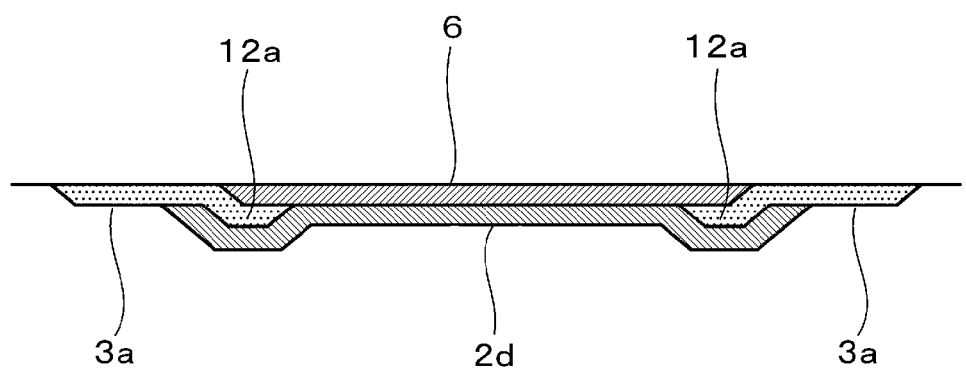
FIG. 7 is a view illustrating the method for manufacturing the ceramic multilayer substrate according to Example 2 of a preferred embodiment of the present invention.

In this pressure bonding step, as shown in FIG. 7, the resin paste pattern 6 presses a portion of the ceramic paste pattern 3a (the cover ceramic layer 3 obtained by firing) and a portion of the electrode paste pattern 2d (the surface electrode 2 obtained by firing), each portion being located under the resin paste pattern 6. As a result, and a recess portion (groove) 12a is formed in the electrode paste pattern 2d (the surface electrode 2 obtained by firing).

Next, this green laminate is fired to burn and decompose the resin paste pattern. As a result, after the resin paste is fired, decomposed, and eliminated, the recess portions are formed.

Accordingly, as shown in FIG. 5, the ceramic multilayer substrate 20 is formed such that the recess portion 12 is provided in the peripheral portion 2a of the surface electrode 2 along the periphery thereof, the peripheral end portion (peripheral edge portion) 2t of the surface electrode 2 and the region 2b in which the recess portion 12 is provided are covered with the cover ceramic layer, and the height of the central portion (exposed portion) 2c, which is not covered with the cover ceramic layer 3, of the surface electrode 2 is lower than the height of the primary surface 10a of the ceramic laminate (substrate body) 10 on which the surface electrode 2 is provided.

In addition, the method for forming the recess portion is not particularly limited, and for example, the recess portion 12 may also be formed by a method in which after the electrode paste pattern 2d prepared by application is dried, embossing is performed thereon.

Figure 8:
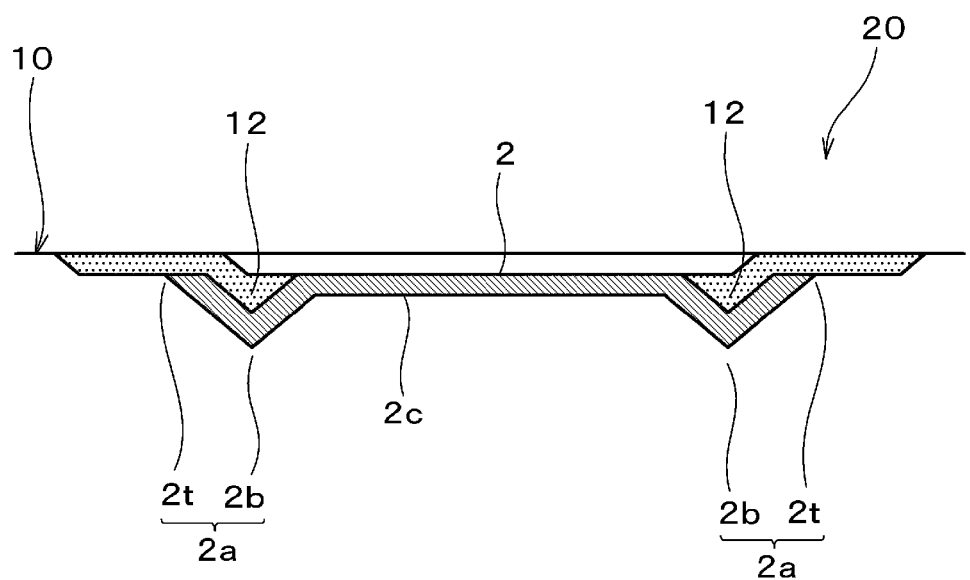
FIG. 8 is a view showing a modified example of the ceramic multilayer substrate according to Example 2 of a preferred embodiment of the present invention.

As a modified example of the ceramic multilayer substrate 20 of Example 2, for example, as shown in FIG. 8, the structure in which the width of a recess portion (groove) provided in the surface electrode 2 is small may be mentioned.

A ceramic multilayer substrate 20 of this modified example is formed by slightly changing the area of the surface electrode 2 covered with the cover ceramic layer 3, that is, by slightly increasing the area of the central portion (exposed portion) 2c.

In the ceramic multilayer substrate according to this modified example, the advantages similar to that of Example 2 can also be obtained.

Figure 9:
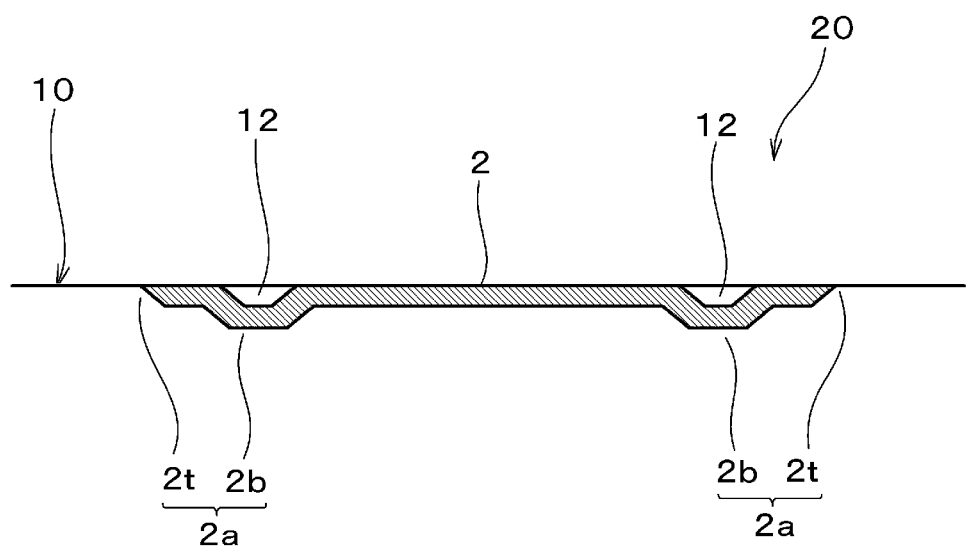
FIG. 9 is a view showing an important portion of a ceramic multilayer substrate according to another example (Example 3) of a preferred embodiment of the present invention.

FIG. 9 is a view showing an important portion of a ceramic multilayer substrate according to another example (Example 3) of a preferred embodiment of the present invention.

In the ceramic multilayer substrate of Example 3, a recess portion 12 is formed in a region withdrawn or located inward from a peripheral end portion (peripheral edge portion) 2t of a surface electrode 2 so as to extend along the periphery thereof.

However, in a ceramic multilayer substrate 20 of Example 3, unlike the ceramic multilayer substrate of each of Examples 1 and 2, no cover ceramic layer to cover a peripheral portion of the surface electrode is provided.

In addition, although not particularly shown in the drawing, the structures of other portions of the ceramic multilayer substrate 20 of Example 3 are preferably similar to those of the ceramic multilayer substrate of Example 1.

In the ceramic multilayer substrate 20 of Example 3, since the recess portion 12 is provided in the region located inward from the peripheral end portion (peripheral edge portion) 2t of the surface electrode 2 so as to extend along the periphery thereof, even when a plating liquid adheres in a plating step, the plating liquid remains in the recess portion (groove) 12 provided in the region withdrawn or located inward from the peripheral end portion (peripheral edge portion) 2t of the surface electrode 2. Hence, the peripheral end portion (peripheral edge portion) 2t of the surface electrode 2 liable to function as a starting point of electrode fracture and/or electrode peeling is suppressed or prevented from being corroded by the plating liquid, and even after the plating step is carried out, a highly reliable ceramic multilayer substrate including a surface electrode 2 with a sufficient peeling strength is provided.

That is, since the thickness of the peripheral end portion (peripheral edge portion) 2t of the surface electrode 2 is small, and plating adhesion thereto is also liable to be insufficient, when the plating liquid remains, the interface between a ceramic layer 1 and the surface electrode 2 becomes fragile due to corrosion of the peripheral end portion (peripheral edge portion) 2t of the surface electrode 2 caused by the plating liquid, and the peripheral end portion (peripheral edge portion) 2t of the surface electrode 2 is liable to function as a starting point of electrode fracture. However, in the region located inward from a peripheral end portion 2t of the surface electrode 2 in which the recess portion 12 is provided, the thickness of the surface electrode 2 is larger than that of a peripheral portion 2t thereof, and even when the plating liquid remains in the recess portion 12, the influence of decrease in peeling strength caused by the corrosion of the surface electrode 2 is within an acceptable range, and hence the peeling strength of the surface electrode 2 is ensured.

This ceramic multilayer substrate 20 of Example 3 can be manufactured, for example, by the following method.

Figure 10:
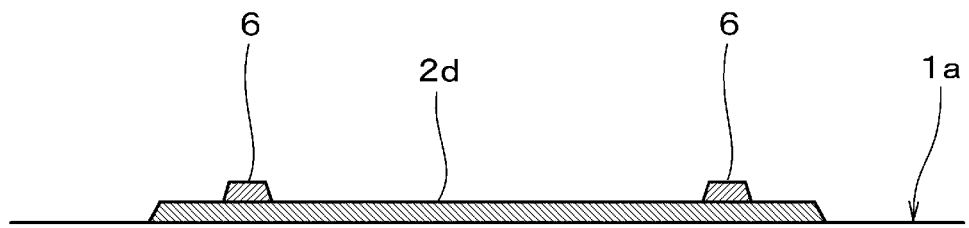
FIG. 10 is a view illustrating a method for manufacturing the ceramic multilayer substrate according to Example 3 of a preferred embodiment of the present invention.

First, as shown in FIG. 10, an electrode paste pattern 2d is formed on the ceramic green sheet 1a by applying an electrode paste used for surface electrode formation.

Subsequently, a resin paste pattern 6 having a width of about 50 μm is formed by applying a resin paste, which is to be fired, decomposed, and eliminated in a firing step, to a region withdrawn or located inward by about 50 μm from a peripheral end portion of the electrode paste pattern 2d so as to extend along the periphery thereof.

In addition, after this ceramic green sheet 1a is laminated with other ceramic green sheets in a predetermined order so as to define the outermost layer, pressure bonding is performed to form a green laminate having a flat primary surface.

Figure 11:
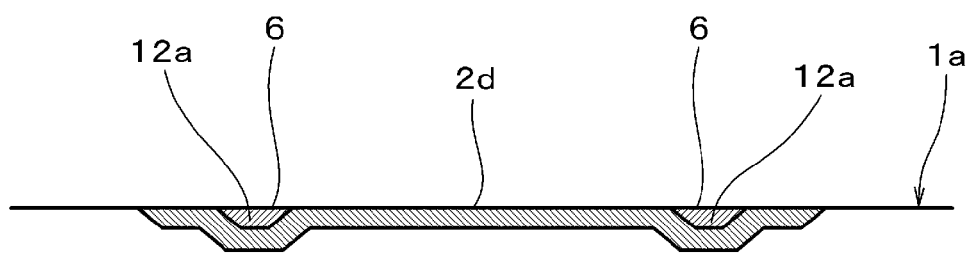
FIG. 11 is a view illustrating the method for manufacturing the ceramic multilayer substrate according to Example 3 of a preferred embodiment of the present invention.

In this pressure bonding step, as shown in FIG. 11, the resin paste pattern 6 presses a portion of the electrode paste pattern 2d (the surface electrode 2 obtained by firing) located under the resin paste pattern 6, so that a recess portion (groove) 12a is formed in the electrode paste pattern 2d (the surface electrode 2 obtained by firing).

In addition, the electrode paste pattern 2d (the surface electrode 2 obtained by firing) itself is also provided in the ceramic green sheet 1a. Hence, the height of the ceramic multilayer substrate 20 obtained by firing is significantly reduced.

Subsequently, this green laminate is fired to burn and decompose the resin paste pattern. As a result, after the resin paste is burned, decomposed, and eliminated, the recess portion is formed.

Accordingly, as shown in FIG. 9, a ceramic multilayer substrate is obtained in which the recess portion 12 is provided in the region withdrawn or located inward from the peripheral end portion (peripheral edge portion) 2t of the surface electrode 2 so as to extend along the periphery thereof.

In addition, in the above example of the manufacturing method, although the entire electrode paste pattern is preferably provided in the ceramic green sheet in the pressure bonding step, the electrode paste pattern may not be entirely provided in the ceramic green sheet. In this case, although a portion of the surface electrode is higher than the primary surface of the laminate, the basic advantages of the present invention are also obtained.

Example 4

Figure 12:
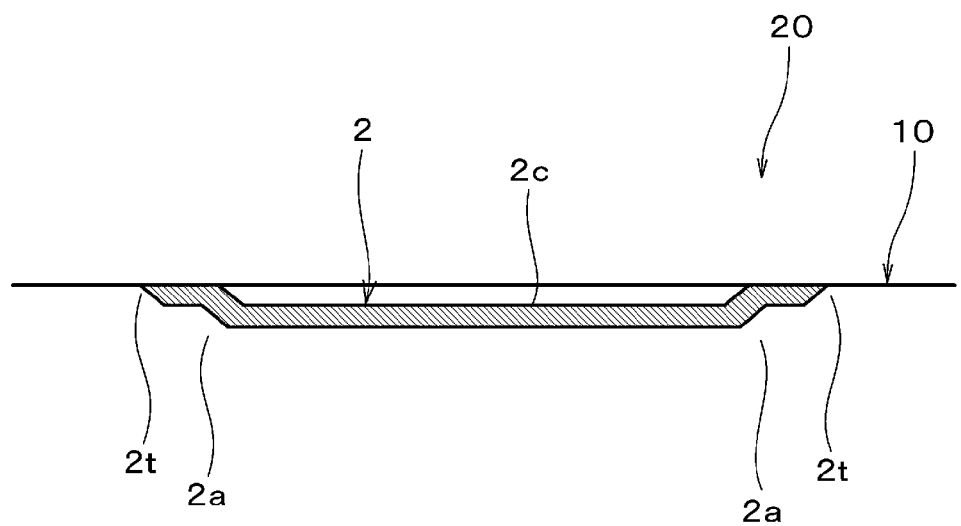
FIG. 12 is a view showing an important portion of a ceramic multilayer substrate according to another example (Example 4) of a preferred embodiment of the present invention.

FIG. 12 is a view showing an important portion of a ceramic multilayer substrate according to another example (Example 4) of a preferred embodiment of the present invention.

In this ceramic multilayer substrate of Example 4, the height of a peripheral portion 2a of a surface electrode 2 is arranged to be higher than the height of a central portion (exposed portion) 2c of the surface electrode 2.

However, in a ceramic multilayer substrate 20 of Example 4, unlike the ceramic multilayer substrate of each of Examples 1 and 2, no cover ceramic layer to cover the peripheral portion of the surface electrode is provided.

In addition, although not particularly shown in the drawing, the structures of other portions of the ceramic multilayer substrate 20 of Example 4 are preferably similar to those of the above ceramic multilayer substrate of Example 1.

In the ceramic multilayer substrate 20 of Example 4, since the height of the peripheral portion 2a of the surface electrode 2 is higher than that of the central portion 2c of the surface electrode 2, and the height of the central portion 2c is lower than that of the peripheral portion 2a, even when a plating liquid remains after a plating step, the plating liquid remains at the central portion 2c located inward from the peripheral portion 2a. Hence, even after the plating step is carried out, a highly reliable ceramic multilayer substrate 20 including a surface electrode 2 with a sufficient peeling strength is reliably provided.

The ceramic multilayer substrate 20 of Example 4 can be manufactured, for example, by the following method.

Figure 13:
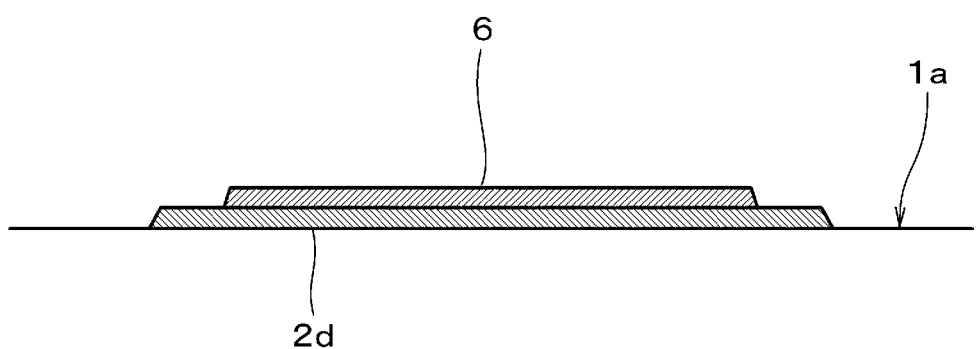
FIG. 13 is a view illustrating a method for manufacturing the ceramic multilayer substrate according to Example 4 of a preferred embodiment of the present invention.

First, as shown in FIG. 13, an electrode paste pattern 2d is formed on the ceramic green sheet 1a by applying an electrode paste used for surface electrode formation.

Subsequently, on a ceramic paste pattern 3a, a resin paste pattern 6 is formed by applying a resin paste, which is to be fired, decomposed, and eliminated in a firing step, to an entire region from a position withdrawn or located inward by about 50 μm from a peripheral end portion of the electrode paste pattern 2d to the inside thereof.

In addition, after the ceramic green sheet 1a is laminated with other ceramic green sheets in a predetermined order so as to define the outermost layer, pressure bonding is performed to form a green laminate including a flat primary surface.

Figure 14:
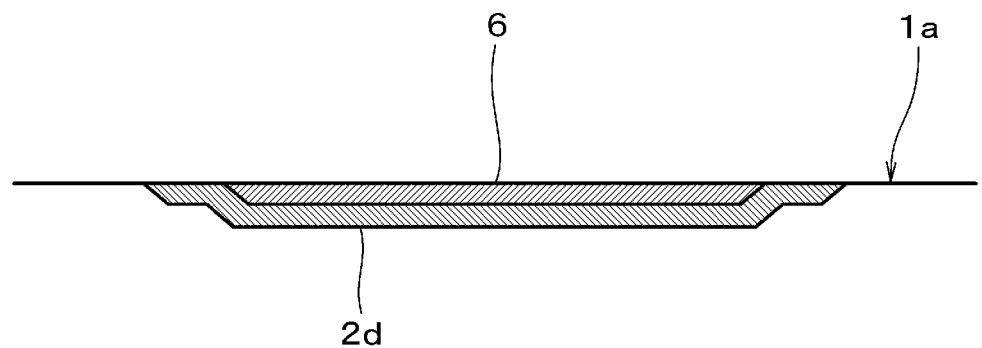
FIG. 14 is a view illustrating the method for manufacturing the ceramic multilayer substrate according to Example 4 of a preferred embodiment of the present invention.

In this pressure bonding step, as shown by the structure of important portions of FIG. 14, the resin paste pattern 6 presses a portion of the electrode paste pattern 2d (the surface electrode 2 obtained by firing) located under the resin paste pattern 6, so that the entire central portion of the electrode paste pattern 2d (the surface electrode 2 obtained by firing) other than the peripheral portion thereof is formed to have a concave shape.

In addition, the electrode paste pattern 2d (the surface electrode 2 obtained by firing) itself is also provided in the ceramic green sheet. Hence, the height of the ceramic multilayer substrate 20 obtained by firing is significantly reduced.

Subsequently, the green laminate is fired to burn and decompose the resin paste pattern. As a result, after the resin paste is burned, decomposed, and eliminated, the recess portion is formed.

Accordingly, as shown in FIG. 12, a ceramic multilayer substrate 20 is obtained in which the height of the peripheral portion 2a of the surface electrode 2 is higher than that of the central portion (exposed portion) 2c of the surface electrode 2.

In addition, in the above example of the manufacturing method, although the entire electrode paste pattern is preferably provided in the ceramic green sheet in the pressure bonding step, the electrode paste pattern may not be entirely provided in the ceramic green sheet. In this case, although a portion (such as the peripheral portion) of the surface electrode is higher than the primary surface of the laminate, the basic advantages of the present invention are also obtained.

The peeling strength of the surface electrode of the ceramic multilayer substrate formed in each of the above examples was investigated. In addition, in order to investigate the peeling strength of the surface electrode, a surface electrode having a shape of, for example, 2 mm □ was formed, and the peeling strength thereof was measured. In this case, the "2 mm □" indicates a regular tetragon having a side dimension of about 2 mm, for example.

Figure 16:
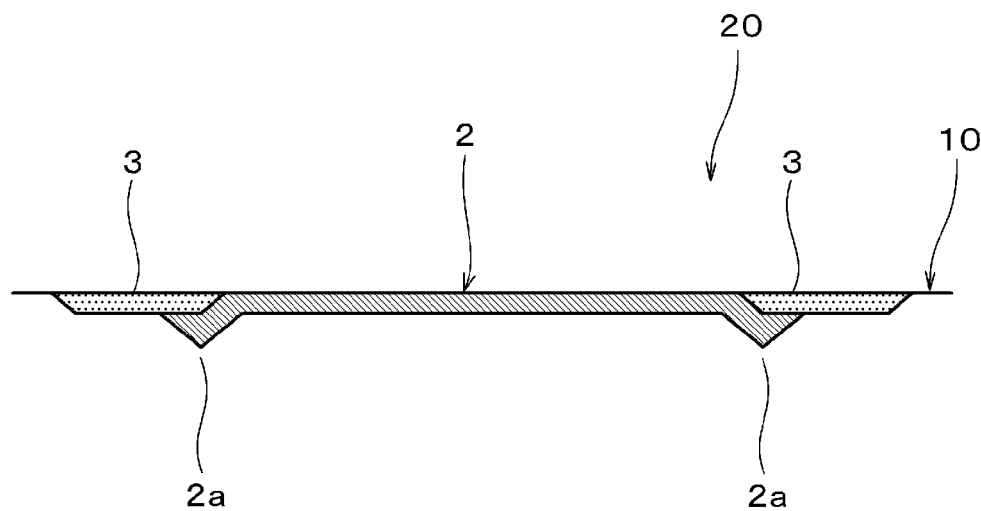
FIG. 16 is a view showing the structure of a surface electrode of a ceramic multilayer substrate used for comparison.
Figure 17:
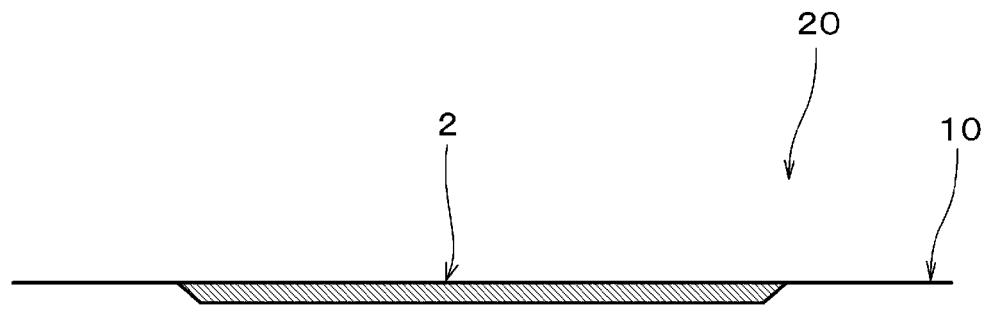
FIG. 17 is a view showing the structure of a surface electrode of another ceramic multilayer substrate used for comparison.
Figure 18:
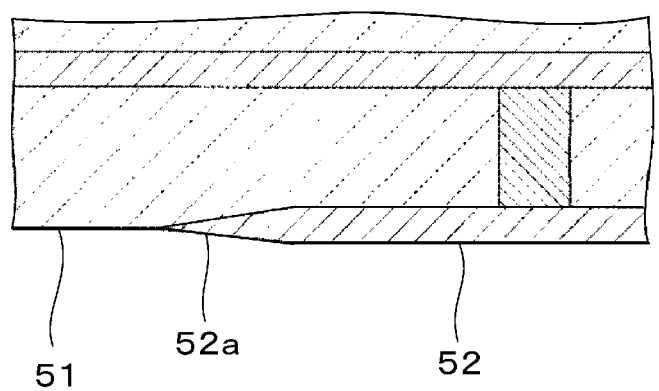
FIG. 18 is a view showing the structure of a surface electrode of a related multilayer substrate.
Figure 19:
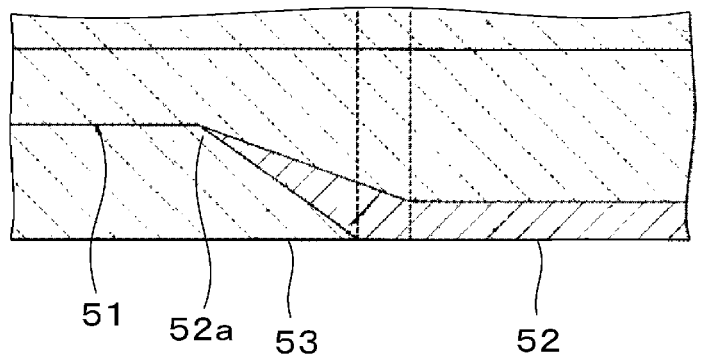
FIG. 19 is a view showing the structure of a surface electrode of another related multilayer substrate.

In addition, for comparison purpose, there were formed a ceramic multilayer substrate 20 (Comparative Example 1) as shown in FIG. 16 in which a surface electrode 2 having a peripheral portion 2a covered with a cover ceramic layer 3 was provided on a surface of a ceramic laminate (substrate body) 10, and a ceramic multilayer substrate 20 (Comparative Example 2) as shown in FIG. 17 in which a surface electrode 2 provided with no cover ceramic layer was provided on a surface of a ceramic laminate (substrate body) 10, and the peeling strength (N/2 mm □) of each of the surface electrodes described above was investigated.

The peeling strength was a peeling strength of the surface electrode measured when a predetermined copper wire was soldered to the surface electrode and was then pulled in a direction perpendicular thereto.

The results are shown in Table 1.

TABLE 1

| SAMPLE | PEELING STRENGTH (N/2 mm□) |
|---|---|
| COMPARATIVE EXAMPLE (RELATED EXAMPLE) 1 | 22 |
| COMPARATIVE EXAMPLE (RELATED EXAMPLE) 2 | 20 |
| SAMPLE 1 OF EXAMPLE | 34 |
| SAMPLE 2-1 OF EXAMPLE | 30 |
| SAMPLE 2-2 OF EXAMPLE | 28 |
| SAMPLE 3 OF EXAMPLE | 29 |
| SAMPLE 4 OF EXAMPLE | 27 |

The samples shown in Table 1 are as follows.
(1) Comparative Example (related example) 1 The ceramic multilayer substrate shown in FIG. 16 in which the surface electrode has the peripheral portion covered with the cover ceramic layer.
(2) Comparative Example (related example) 2 The ceramic multilayer substrate shown in FIG. 17 in which the surface electrode is not covered with a cover ceramic layer.
(3) Sample 1 of Example The ceramic multilayer substrate formed in Example 1 to have the surface electrode shown in FIGS. 1 and 2.
(4) Sample 2-1 of Example The ceramic multilayer substrate formed in Example 2 to have the surface electrode shown in FIG. 5.
(5) Sample 2-2 of Example The ceramic multilayer substrate formed in Example 2 as a modified example to have the surface electrode shown in FIG. 8.
(6) Sample 3 of Example The ceramic multilayer substrate formed in Example 3 to have the surface electrode shown in FIG. 9.
(7) Sample 4 of Example The ceramic multilayer substrate formed in Example 4 to have the surface electrode shown in FIG. 12.
As shown in Table 1, while in the ceramic multilayer substrates of Comparative Examples 1 and 2, each of which does not satisfy the conditions of the present invention, the peeling strengths of the surface electrodes were insufficient, such as 22 N/2 mm □ and 20 N/2 mm □, respectively, in the ceramic multilayer substrates of Examples 1 to 4, each of which satisfies the conditions of the present invention, it was confirmed that the peeling strength of the surface electrode was significantly improved to about 27 N/2 mm □ to about 34 N/2 mm □, for example.
The present invention is not limited to the examples of various preferred embodiments described above, and for example, constituent materials, specific shapes, the number, and an arrangement mode of the surface electrodes; an arrangement mode thereof when the cover ceramic layers are provided; a specific composition of ceramic forming the cover ceramic layer; the number of ceramic layers to be laminated to provide the ceramic substrate; an arrangement mode of internal conductors; and a specific composition of ceramic forming the ceramic substrate may be variously changed and modified without departing from the scope of the present invention.

Figure 15A:
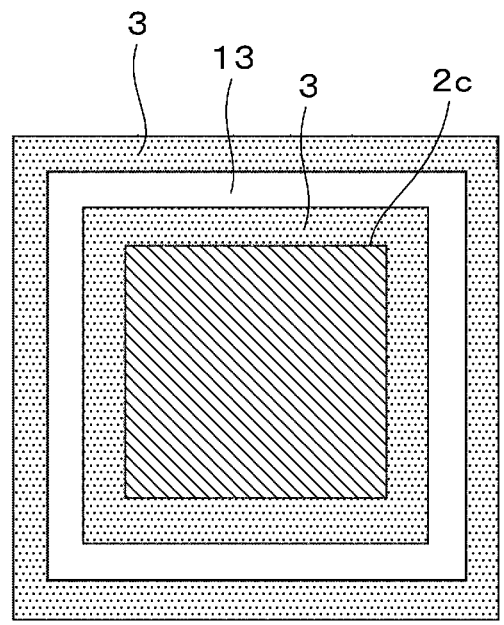
FIG. 15A is a top plan view of the ceramic multilayer substrate according to Example 1 of a preferred embodiment of the present invention, and 15B is a top plan view of a ceramic multilayer substrate of a modified example of a preferred embodiment.
Figure 15B:
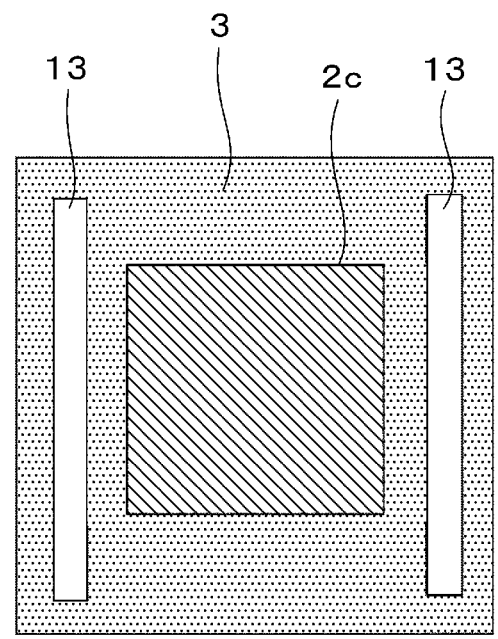

In addition, in FIG. 2 of Example 1, the recess portion is preferably provided in the peripheral portion 2a of the surface electrode 2 so as to extend along the periphery thereof, and when this recess portion 12 is viewed from an upper surface of the ceramic multilayer substrate 20 in the lamination direction, a plan view as shown in FIG. 15A is obtained. However, not only in the case in which the recess portion is arranged to extend along the periphery of the surface electrode, but also in the case in which the recess portion is provided in a portion of the peripheral portion of the surface electrode, a surface electrode having a sufficient peeling strength can also be provided. For example, as shown in FIG. 15B, when recess portions 12 are provided in two peripheral portions of the surface electrode 2 facing each other, a surface electrode 2 having a sufficient peeling strength is provided.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A ceramic multilayer substrate comprising: a ceramic laminate including first and second primary surfaces opposed to each other and ceramic layers laminated to each other and a surface electrode located on a portion of the first primary surface of the ceramic laminate: a cover ceramic layer arranged to cover a peripheral portion of the surface electrode wherein a recess portion is provided in a region of the surface electrode spaced inward from a peripheral end portion of the surface electrode; the recess portion is substantially V shaped; the surface electrode includes a first surface adjacent to the first primary surface of the ceramic laminate and a second surface opposed to the first surface and spaced away from the first primary surface of the ceramic laminate; a height between the second surface of the surface electrode in the recess portion and the second primary surface of the ceramic laminate is less than a height between the second surface of the surface electrode at the peripheral end portion and the second primary surface of the ceramic laminate; and a height between the first surface of the surface electrode in the recess portion and the second primary surface of the ceramic laminate is less than a height between the first surface of the surface electrode at the peripheral end portion and the second primary surface of the ceramic laminate, the height between the first surface of the surface electrode at the peripheral end portion and the second primary surface of the ceramic laminate is less than or equal to a height between the first primary surface and the second primary surface of the ceramic laminate and wherein the cover ceramic layer is disposed in the recess portion of the surface electrode and the cover ceramic layer includes a V-shaped groove and an outermost surface wherein the outermost surface of the cover ceramic layer is flush with the first primary surface of the ceramic laminate.

2. The ceramic multilayer substrate according to claim 1, wherein the recess portion extends along a periphery of the surface electrode.

3. The ceramic multilayer substrate according to claim 1, wherein at least a portion of the surface electrode is provided in the first primary surface of the ceramic laminate.

4. The ceramic multilayer substrate according to claim 1, further comprising a plating film located on at least a portion of the second surface of the surface electrode.

5. The ceramic multilayer substrate according to claim 1, further comprising another recess portion provided in another portion of the surface electrode.

6. A ceramic multilayer substrate comprising: a ceramic laminate including first and second primary surfaces opposed to each other and ceramic layers laminated to each other; and a surface electrode located on a portion of the first primary surface of the ceramic laminate; and a cover ceramic layer arranged to cover a peripheral portion of the surface electrode; wherein a recess portion is provided in a region spaced inward from a peripheral end portion of the surface electrode; the recess portion is substantially V shaped; a height of a peripheral portion of the surface electrode is higher than a height between a central portion of the surface electrode; the surface electrode includes a first surface adjacent to the first primary surface of the ceramic laminate and a second surface opposed to the first surface and spaced away from the first primary surface of the ceramic laminate; a height of a central portion of the second surface of the surface electrode and the second primary surface of the ceramic laminate is less than a height between the first primary surface of the ceramic laminate and the second primary surface of the ceramic laminate; and a height between the first surface of the surface electrode in the peripheral portion and the second primary surface of the ceramic laminate is less than a height between the first surface of the surface electrode at the peripheral end portion and the second primary surface of the ceramic laminate, the height between the first surface of the surface electrode at the peripheral end portion measured from the second primary surface of the ceramic laminate is less than or equal to a height between the first primary surface and the second primary surface of the ceramic laminate and wherein the cover ceramic layer is disposed in the recess portion of the surface electrode and the cover ceramic layer includes a groove and an outermost surface wherein the outermost surface of the cover ceramic layer is flush with the first primary surface of the ceramic laminate.

7. The ceramic multilayer substrate according to claim 6, wherein at least a portion of the surface electrode is provided in the first primary surface of the ceramic laminate.

8. The ceramic multilayer substrate according to claim 6, further comprising a plating film located on at least a portion of the second surface of the surface electrode.

9. The ceramic multilayer substrate according to claim 6, wherein the recess portion extends along a periphery of the surface electrode.

10. The ceramic multilayer substrate according to claim 6, further comprising another recess portion provided in another portion of the surface electrode.

11. The ceramic multilayer substrate according to claim 6 wherein at least a portion of the surface electrode is provided in the first primary surface of the ceramic laminate.

12. A ceramic multilayer substrate comprising: a ceramic laminate including first and second primary surfaces opposed to each other and ceramic layers laminated to each other; a surface electrode located on a portion of the first primary surface of the ceramic laminate; and a cover ceramic layer arranged to cover a peripheral portion of the surface electrode; wherein a recess portion is located in the peripheral portion of the surface electrode; the recess portion is substantially V shaped; the peripheral portion of the surface electrode includes a peripheral end portion and a region in which the recess portion is covered with the cover ceramic layer; the surface electrode includes a first surface adjacent to the first primary surface of the ceramic laminate and a second surface opposed to the first surface and spaced away from the first primary surface of the ceramic laminate; a height between a central portion of the second surface of the surface electrode and the second primary surface of the ceramic laminate is less than a height between the first primary surface of the ceramic laminate and the second primary surface of the ceramic laminate; and a height between the first surface of the surface electrode in the recess portion and the second primary surface of the ceramic laminate is less than a height between the first surface of the surface electrode at the peripheral end portion and the second primary surface of the ceramic laminate, the height between the first surface of the surface electrode at the peripheral end portion and the second primary surface of the ceramic laminate is less than or equal to the height between the first primary surface and the second primary surface of the ceramic laminate and wherein the cover ceramic layer is disposed in the recess portion of the surface electrode and the cover ceramic layer includes a groove and an outermost surface and wherein the outermost surface of the cover ceramic layer is flush with the first primary surface of the ceramic laminate.

13. The ceramic multilayer substrate according to claim 12, wherein the recess portion extends along a periphery of the surface electrode.

14. The ceramic multilayer substrate according to claim 12, wherein at least a portion of the surface electrode is provided in the first primary surface of the ceramic laminate.

15. The ceramic multilayer substrate according to claim 12, further comprising a plating film located on at least a portion of the second surface of the surface electrode.

16. The ceramic multilayer substrate according to claim 12, wherein the recess portion is provided in a region spaced inward from a peripheral end portion of the surface electrode.

17. The ceramic multilayer substrate according to claim 12, further comprising another recess portion provided in another portion of the surface electrode.

* * * * *